(12) United States Patent
Hampel et al.

(10) Patent No.: US 6,304,104 B1
(45) Date of Patent: Oct. 16, 2001

(54) METHOD AND APPARATUS FOR REDUCING WORST CASE POWER

(75) Inventors: Craig Edward Hampel, San Jose; Donald Victor Perino, Los Altos, both of CA (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 09/394,984

(22) Filed: Sep. 13, 1999

(51) Int. Cl.⁷ .................................................. H03K 19/21
(52) U.S. Cl. ................................. 326/52; 326/93
(58) Field of Search .................. 326/52, 93, 95; 327/31

(56) References Cited

U.S. PATENT DOCUMENTS

| | | | |
|---|---|---|---|
| 4,646,297 | * 2/1987 | Palmquist et al. | 327/31 |
| 4,922,122 | * 5/1990 | Dubujet | 326/95 |
| 5,614,841 | 3/1997 | Marbot et al. | 326/52 |
| 5,721,503 | * 2/1998 | Burns et al. | 326/52 |

OTHER PUBLICATIONS

The International Search Report mailed Dec. 14, 2000 for PCT Counterpart Application No. PCT/US00/25270.

* cited by examiner

*Primary Examiner*—Trong Phan
(74) *Attorney, Agent, or Firm*—Lee & Hayes, PLLC

(57) ABSTRACT

An apparatus for reducing worst-case power consumption. The apparatus includes a first signal that has signal transitions. A circuit path is provided for transmitting a second signal through buffered circuit sections. Logic circuitry is coupled to the circuit path and to the first signal. The logic circuitry uses the first signal to reduce a sum of signal transitions of the second signal as the second signal propagates from one buffered section of the circuit path to another buffered section of the circuit path in order to reduce worst-case power consumption.

22 Claims, 18 Drawing Sheets

FIG. 4

PEAK SYSTEM POWER (APPROXIMATE)

|  | (90) WITHOUT ALT SIGNAL | (92) WITH ALT SIGNAL |
|---|---|---|
| • BEST CASE DATA PATTERN (91) | Ø WATTS | X/2 WATTS + Δ |
| • TYPICAL DATA PATTERN (93) | X/2 WATTS | X/2 WATTS + Δ |
| • WORST CASE DATA PATTERN (95) | X WATTS | X/2 WATTS + Δ |

FIG. 6

METHOD AND APPARATUS FOR REDUCING WORST CASE POWER

FIELD OF THE INVENTION

The present invention pertains to an electronic system and, more particularly, to a method and apparatus for reducing the maximum power drawn by the electronic system.

BACKGROUND OF THE INVENTION

An electronic system typically has a power supply that is selected to provide a sufficient amount of power to the system under all operating conditions. The size of the power supply is determined by the maximum peak power used by the electronic system because the maximum peak power condition is a condition that needs to be handled by the electronic system. The maximum peak power (also called peak power or worst case power) required by the electronic system can sometimes be a relatively large number as compared with average power required by the electronic system.

High peak power typically results in the need for power supplies that are larger, heavier, more costly, and less energy efficient, which is a disadvantage. Moreover, other more costly electronic components may need to be used for an electronic system with a relatively high peak power characteristic. For example, a higher peak power characteristic may require the need for more bypass capacitors and larger bypass capacitors.

In addition, operating an electronic system at or near peak power is typically disadvantageous. When the system operates at or near worst-case conditions, the operating temperature of the circuits and components in the system is generally elevated. If the system operates at or near the worst-case operating condition for an extended period of time, the elevated temperatures may tend to cause failures in the system resulting in a less reliable system. To help to avoid such failures, cooling systems can be included in the electronic systems. Cooling systems, however, typically add cost, complexity, and weight to a system. If fans are added to cool a system, that can result in noise and in power use by the fan. Heat sinks sometimes mean larger packages are required to accommodate the heat sink and to allow for ventilation.

Operating an electronic system at maximum peak power may also increase the amount of electromagnetic interference ("EMI") generated over time, which could increase amount of EMI shielding required for the electronic system.

For electronic systems that use complementary metal oxide semiconductor ("CMOS") logic, the power drawn by a circuit or component is shown in Equation 1 below, wherein P is the power drawn by the system, f is the operating frequency or data rate, C is the capacitance, and V is the voltage swing of the voltage output of the circuit.

$$P + fCV^2 \qquad \text{(Equation 1)}$$

As shown by Equation 1, the power drawn by a CMOS logic gate is directly proportional to the frequency or data rate of the logic gate. Thus, the greater the rate, the greater the power drawn by the logic gate for a given capacitance and voltage swing. Equation 1 also indicates that, for a given capacitance, a maximum amount of power is drawn by a CMOS logic gate when the voltage swing is a maximum amount (e.g., when changing logic states) in every cycle and the logic gate is operating at a maximum data rate.

CMOS logic gates are often used within an integrated device and between integrated devices to drive relatively high capacitance lines. For example, CMOS logic gates are often used in integrated circuits as output buffers to drive, for example, data bus lines. If these gates switch logic states at the maximum data rate, then large amounts of power may be drawn by the system. Even though the data pattern that corresponds to this is atypical, the cooling mechanism must be designed to handle this event. Otherwise, failures in the electronic system could occur as the result of the elevated temperatures. But, as stated above, cooling systems can add cost, complexity, and weight to a system.

FIGS. 1 and 2 show how prior art circuitry can operate at maximum peak power for a given clock frequency. FIG. 1 is a diagram of prior art circuitry 19 that includes signal line 3, which is one of the "N" signal lines of data bus 4. Each of the signal lines of data bus 4 includes buffers 5 and 10. Signal line 3 includes parasitic capacitance represented by capacitors 21 and 22. Waveforms 28, 30, and 35 represent possible data patterns at respective points 18, 20, and 25 of a waveform that is transmitted along signal line 3.

FIG. 2 is a table showing the toggling of signals along signal line 3. Column 40 shows a two-period snapshot of possible waveforms at point "A" (reference number 18). Column 42 shows the number of signal transitions—i.e., toggles—for the possible respective waveforms at point "A." Column 46 shows a two-period snapshot—i.e., a two-bit snapshot—of possible waveforms at point "B" (reference number 20). Column 48 sets forth the number of signal transitions, for the respective waveforms at point B. Column 50 shows a two-period snapshot of possible waveforms at point "C" (reference number 25). Column 52 refers to the number of toggles for the respective waveforms at point C.

Column 54 of FIG. 2 sets forth the sum of the toggles occurring at points B and C along signal line 3. The sum in column 52 is for the same wave front traveling through points B and C along signal line 3. The sum of the toggles at points B and C is zero for the waveforms that have no signal transitions—i.e., the waveforms that stay at zero or a logic one. For the waveforms that toggle from logic one to a logic zero, or from a logic zero to a logic one, the sum of the toggles at points B and C is two because there is one toggle at point B and another toggle at point C.

For a given waveform, when the sum in column 54 is two, that means that the circuitry shown in FIG. 1 is operating at maximum peak power. For CMOS circuitry, power is consumed during the signal transitions. The more signal toggles there are, the more power consumed by the circuitry. Thus, when the sum of the toggles at buffered areas B and C totals two, that means that the maximum peak power is being consumed for a given clock frequency.

SUMMARY OF THE INVENTION

One object of the present invention is to provide a method and apparatus for reducing the worst-case power drawn by a system.

An apparatus for reducing worst-case power consumption is described. The apparatus includes a first signal that has signal transitions. A circuit path is provided for transmitting a second signal through buffered circuit sections. Logic circuitry is coupled to the circuit path and to the first signal to reduce a sum of signal transitions of the second signal as the second signal propagates from one buffered section of the circuit path to another buffered section of the circuit path in order to reduce worst-case power consumption.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 4 is a table showing a summation of signal toggles for the circuit of FIG. 3 when signal "ALT" has signal transitions.

FIG. 6 is a comparison table showing system power with and without an "ALT" signal.

DETAILED DESCRIPTION

Embodiments are described for reducing the amount of worst-case power drawn by or dissipated by a system by dividing the system into sections and reformatting data communicated between sections. For one embodiment of the present invention, a sum of signal transitions is reduced as the signal propagates from one buffered circuit section to another buffered circuit section. This reduces the worst-case maximum power drawn by the system.

Thus, an intended advantage of an embodiment of the invention is to reduce worst-case maximum power. The following other possible intended advantages may follow from reducing the worst-case maximum power: the need for a smaller power supply, the use of fewer bypass capacitors, the use of smaller bypass capacitors, an extension of the life of electrical components, a reduction in EMI, the need for less EMI shielding, the need for smaller heat sinks, and the need for less ventilation. Many of the intended advantages, such as the need for a smaller power supply, could translate into reduced cost of an electrical system.

Figure 3:
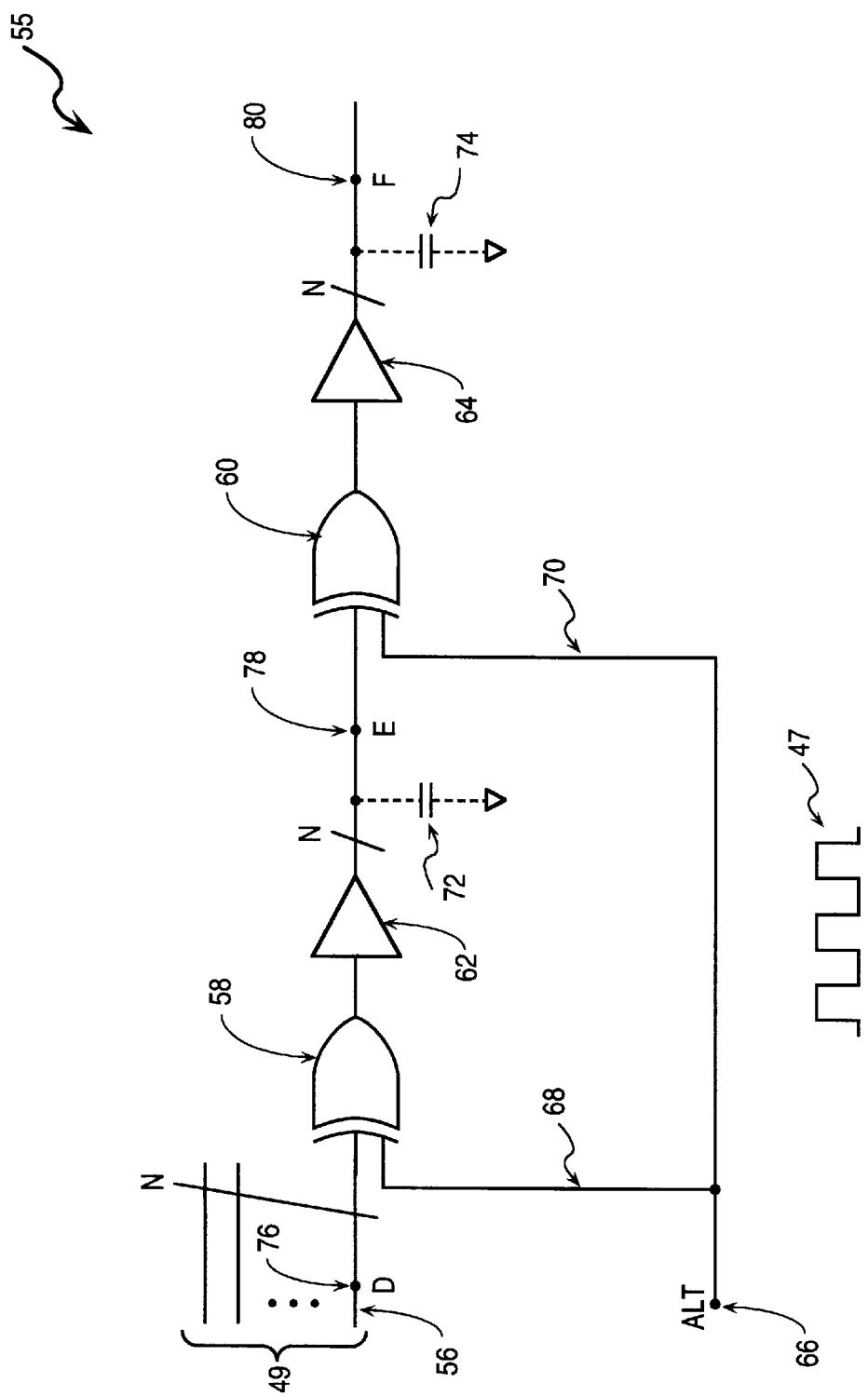
FIG. 3 illustrates one embodiment of a signal path having two exclusive-OR ("XOR") gates and a periodic signal "ALT."

FIG. 3 illustrates circuitry 55, which is an embodiment of the invention for data bus 49 containing N signal lines, one of which is signal line 56. Signal line 56 includes exclusive-OR ("XOR") gates 58 and 60, buffers 62 and 64, and parasitic capacitors 72 and 74. Each of the other signal lines of data bus 49 similarly includes XOR gates, buffers, and parasitic capacitors.

Buffers 62 and 64 divide the circuit 55 into buffered circuit sections. Point D (reference number 76) is to the left of buffer 62. Point E (reference number 78) is between buffers 62 and 64. Point F (reference 80) is to the right of buffer 64.

For one embodiment, data bus 49 and signal line 56 have a relatively high capacitance. The longer and more loaded data bus 49 is, the higher the bus capacitance. Given that power equals frequency times capacitance times the voltage swing squared, circuitry 55 can dissipate a relatively large amount of power for a given voltage swing and a given frequency. Given the high capacitance, it is one of the intended advantages of the embodiment to reduce the number of voltage swings—i.e., reduce the number of signal transitions—in order to reduce the maximum worst-case power dissipated by circuitry 55.

For alternative embodiments of the invention, other types of transmission lines would be used in place of data bus 49 and signal line 56. Various types of periodic signals could be transmitted on line 56. For example, line 56 could be used to transmit address information, control information, code, frame relay packets, ATM (asynchronous transfer mode) cells, or TCP/IP information. For alternative embodiments, the transmission lines could have various levels of capacitance.

Circuitry 55 of FIG. 3 includes an "ALT" signal that is applied as an input to XOR gate 58 via lines 66 and 68, and as an input to XOR gate 60 via lines 66 and 70. The ALT signal is also applied to the inputs of the respective XOR gates on the other signal lines of data bus 49. Lines 66, 68, and 70 are of lower capacitance than signal line 56.

For one embodiment, the ALT signal is a periodic signal having a square wave pattern, such as signal 47 shown in FIG. 3. For one embodiment, the ALT signal has the same frequency as the data signal transmitted on line 56. The ALT signal may be generated from a counter, a clock source, or other circuitry that allows ALT to have approximately the same frequency as the fastest data rate of the data provided over signal line 56.

For alternative embodiments, the ALT signal has a frequency lower than the frequency of the data signal on signal line 56. For example, the ALT signal could have a frequency one-half of the frequency of the data signal on signal line 56.

For one embodiment, the data waveform (also called the data signal) at point D has a certain format or pattern. For example, one pattern might be a regular square wave. The XOR gate 58 receives the data waveform as one of the inputs to XOR gate 58. A periodic ALT signal having the same frequency as the data waveform is the other input to XOR gate 58. The output of XOR gate 58 is a waveform that has an altered pattern or format. The altered waveform passes through buffer 62. Therefore, the pattern of the data waveform is different at point E than the pattern at point D.

The XOR gate 60 receives the altered waveform as one the inputs to that gate. The other input to XOR gate 60 is the ALT signal. The output of XOR gate 60 is a data waveform that has the same format as the waveform at point D. The waveform passes through buffer 64. Therefore, the data waveform has the same pattern at point F as the waveform at point D.

The altered data pattern at point E results in a reduced sum of signal transitions as the data waveform propagates from point E to point F on signal line 56. Reducing the sum of signal transitions reduces the peak power used by circuitry 55. The average power consumed by circuitry 55 remains approximately the same, although slightly elevated due to the presence of the ALT signal. Nevertheless, reducing the peak power consumed means that a smaller power supply can be used, for example, because a power supply is designed to handle the peak power consumed by a circuit. Application of the embodiment in various electronic systems could also result in the use of fewer or smaller bypass capacitors, an extension of the life of electronic components, reduced EMI, and the reduced need for heat sinks and other cooling mechanisms.

A reduction in the peak power of circuitry 55 is achieved even if the ALT signal is one-half the frequency of the data signal on line 56, for example.

For an alternative embodiment, the data signal line 56 operates in a current mode. For the current mode, the worst-case power situation is when signal line 56 is at a constant high current level and is not toggling. For that alternative constant-current embodiment, a toggling ALT signal applied to XOR gates 58 and 60 serves to break up the constant high current into a toggling data pattern at point E, which reduces the peak power. The XOR gate 60 then outputs a constant high current, however, so that the data patterns at points F and D are the same.

Figure 4:
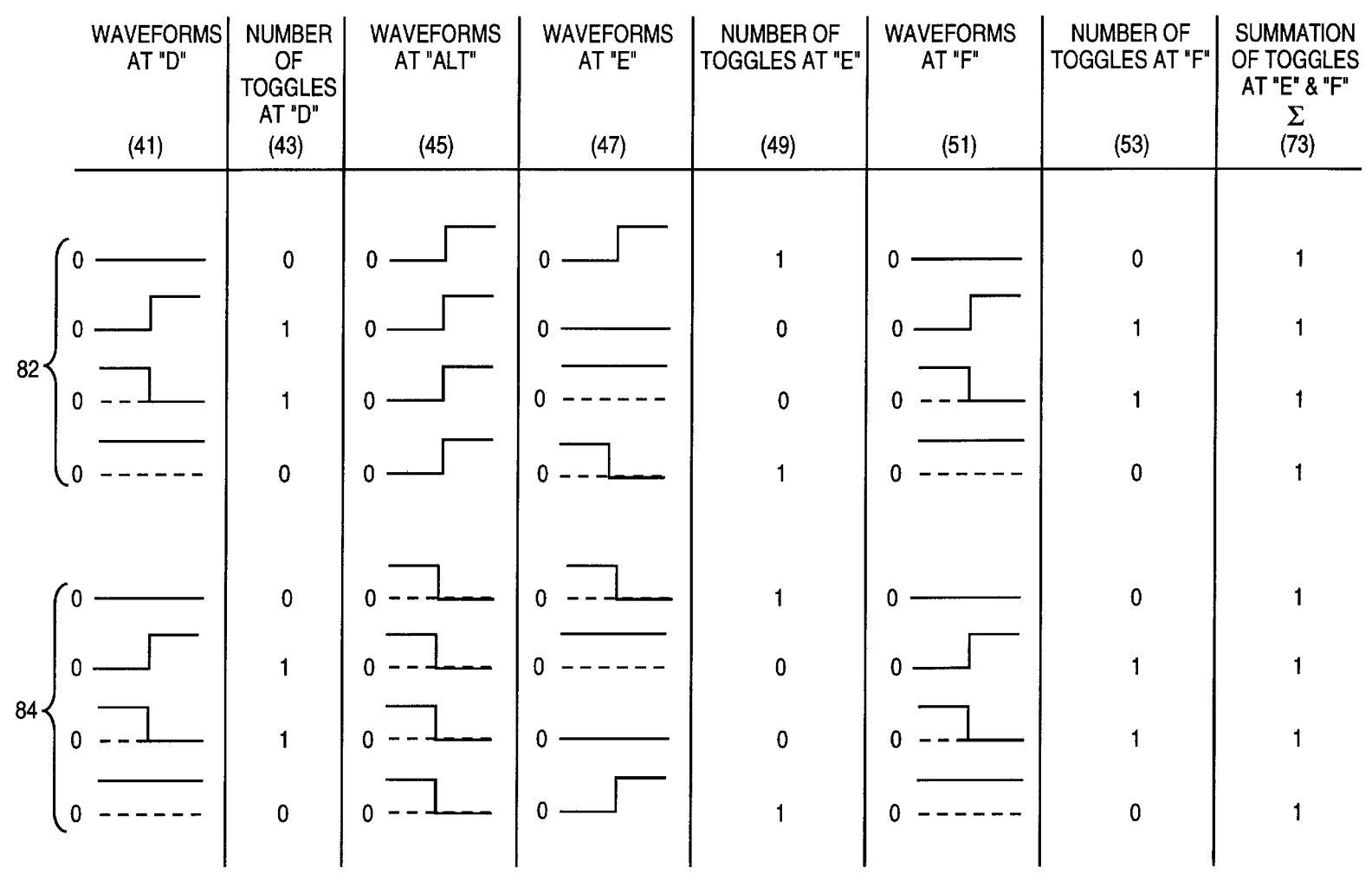

FIG. 4 is a chart showing the various waveforms at points D, E, and F of the circuitry 55 of FIG. 3 for ALT signals that toggle. FIG. 4 also sets forth the number of signal transitions—i.e., toggles.

Column 41 of FIG. 4 shows a two-bit snapshot of waveforms 82 and 84 that are possible at point D of circuitry 55. Waveforms 82 include the case of the remain-at-logic zero waveform, a waveform toggling from logic zero to logic one, a waveform toggling from logic one to logic zero, and a waveform remaining at logic one. Column 43 sets forth the number of toggles associated with each respective waveform of waveforms 82 and 84.

Column 45 sets forth two types of toggling ALT waveforms. For waveforms 82, the ALT waveforms toggle from logic zero to logic one. For waveforms 84, the ALT waveforms toggle from logic one to logic zero.

Column 47 sets forth the resulting respective waveforms at point E of circuitry 55. The waveforms at point E are the result of the XOR operation performed by XOR gate 58 between the waveforms at point D and the ALT signal. As seen in FIG. 4, the waveforms at point E differ from the waveforms at point D. The number of signal transitions at point E is indicated in column 49.

The waveforms at point F are set forth in column 51. The waveforms at point F are the result of an XOR operation performed by XOR gate 60 with respect to the ALT signals and the respective waveforms at point E. Column 53 shows the number of signal transitions at point F for the respective waveforms at point F.

As shown in FIG. 4, the waveforms at point F have the same pattern or format as the waveforms at point D. Thus, although a waveform that is output by circuitry 55 has the same pattern as the waveform that is applied as an input to circuitry 55, the intermediate waveform—i.e., the waveform at point E—is altered or reformatted.

Column 73 sets forth the summation of signal transitions at points E and F on signal line 56. The total is "one" for each of the respective waveforms of waveforms 82 and 84.

Figure 2:
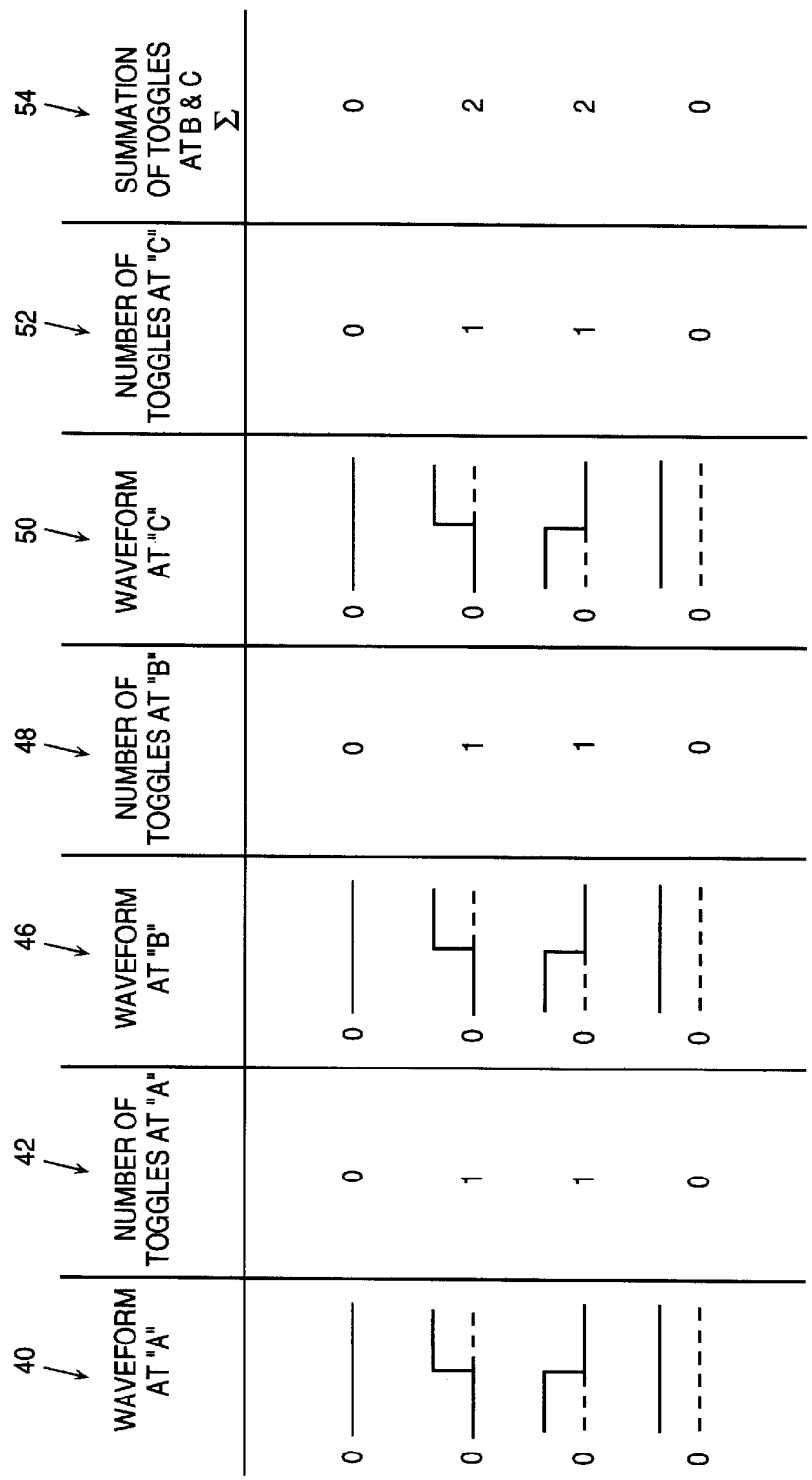
FIG. 2 shows a summation of signal toggles for various waveforms transmitted over the prior art signal path of FIG. 1.

The totals in column 73 of FIG. 4 contrast with the totals in column 54 of FIG. 2. None of the sums in column 73 is a "two." Column 73 of FIG. 4 shows that circuitry 55 of FIG. 3 reduces the worst-case maximum power, also called peak power, because there are no double toggles at points E and F. The sum of the number of toggles at points E and F is proportional to the peak power of circuitry 55.

Figure 5:
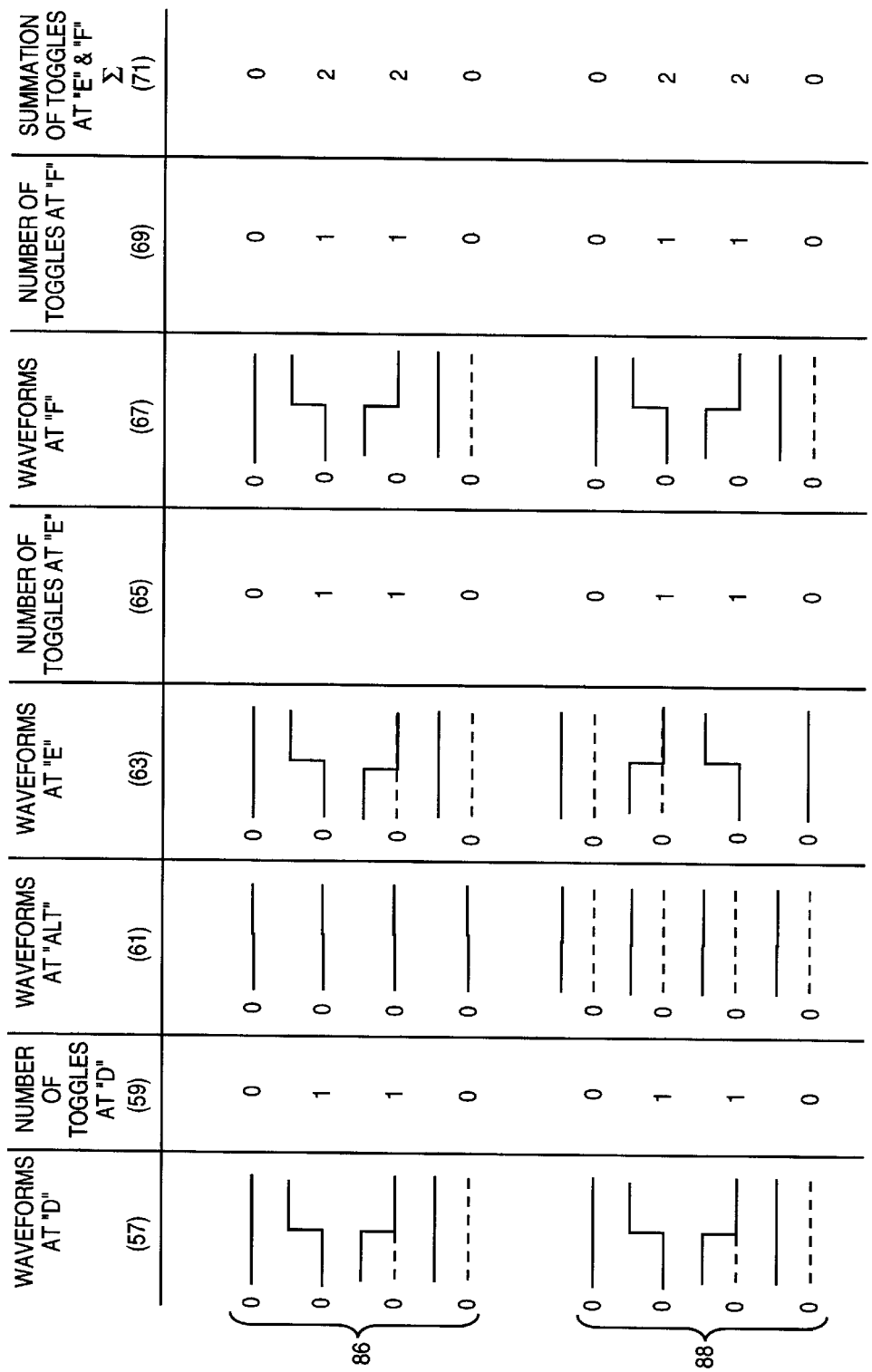
FIG. 5 is a table showing a summation of signal toggles for the circuit of FIG. 3 when signal "ALT" does not have signal transitions.

One of the other advantages of the circuitry 55 of FIG. 3 is that the data pattern at point F is not altered even if the ALT signal fails to toggle. This is shown by FIG. 5, which shows the waveforms for an alternative embodiment wherein the ALT signal fails to toggle. Column 57 shows the various data waveforms 86 and 88 at point D of circuitry 55. Column 59 shows the number of toggles at point D for the respective waveforms. Column 61 shows the ALT waveforms that do not toggle—i.e., ALT stays at either zero to one. Column 63 shows the respective waveforms at point E. Column 65 sets forth the number of toggles at point E. When the ALT signal does not toggle, the waveforms at point E of circuitry 55 have the same pattern as the waveforms at point D.

Column 67 shows the respective waveforms at point F. Column 69 sets forth the number of toggles at point F. Thus, when the ALT signal does not toggle, the waveforms at point F have the same pattern has the waveforms at points D and E of circuitry 55.

Column 71 of FIG. 5 sets forth the sum of the signal transitions at points E and F of circuitry 55 when the ALT signal does not toggle. The sum in column 71 is "two" when the waveforms 86 and 88 toggle. Thus, when the ALT signal does not toggle, the peak power of circuitry 55 is not reduced. If the ALT signal does not toggle, the waveform at point F nevertheless has the same pattern as the waveform at point D.

Figure 1:
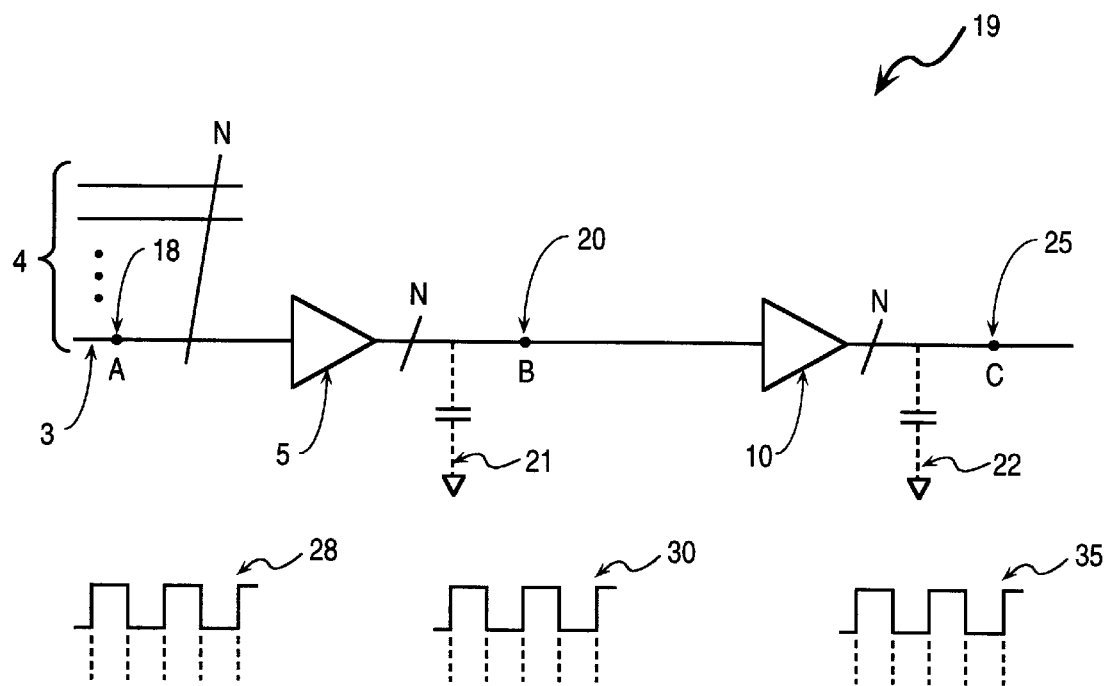
FIG. 1 shows a prior art buffered signal path for transmitting signals or data.

FIG. 6 shows the approximate peak power for various data patterns. Column 90 shows the peak power used by prior art circuitry 19 of FIG. 1 that does not include any ALT signal or related ALT circuitry. Column 92 shows the peak power used by circuitry 55 of FIG. 3 that includes the ALT signal and XOR gates 58 and 60. Row 91 of FIG. 6 is for the best case data pattern which would be a level signal without any toggles. Row 95 is for a worst-case data pattern, which would be a signal toggling every clock cycle. Row 93 would be for a typical data pattern, which would be expected to be one-half the number of toggles associated with the worst-case data pattern.

For prior art circuitry 19 without the ALT signal, the worst-case data pattern typically triggers a peak power of X watts, wherein X is a nonzero positive number. A typical data pattern for circuitry 19 typically results in peak power usage of approximately X/2 watts. The best case data pattern typically results in approximately zero watts of peak power.

In contrast, the circuitry 55 of FIG. 3 uses for any data pattern approximately X/2 watts plus delta watts. The delta is a small number associated with the toggling of the ALT signal and the power consumed by the XOR gates 58 and 60.

Thus circuitry 55 helps to keep peak power from rising to the level of X watts. The trade-off is that for all the data patterns the peak power is X/2 watts plus delta watts.

There is a difference between average power and peak power. The average power consumed by circuits 19 and 55 is approximately the same, although circuitry 55 consumes slightly more average power due to the toggling of the ALT signal and the presence of the XOR gates 58 and 60.

Figure 7:
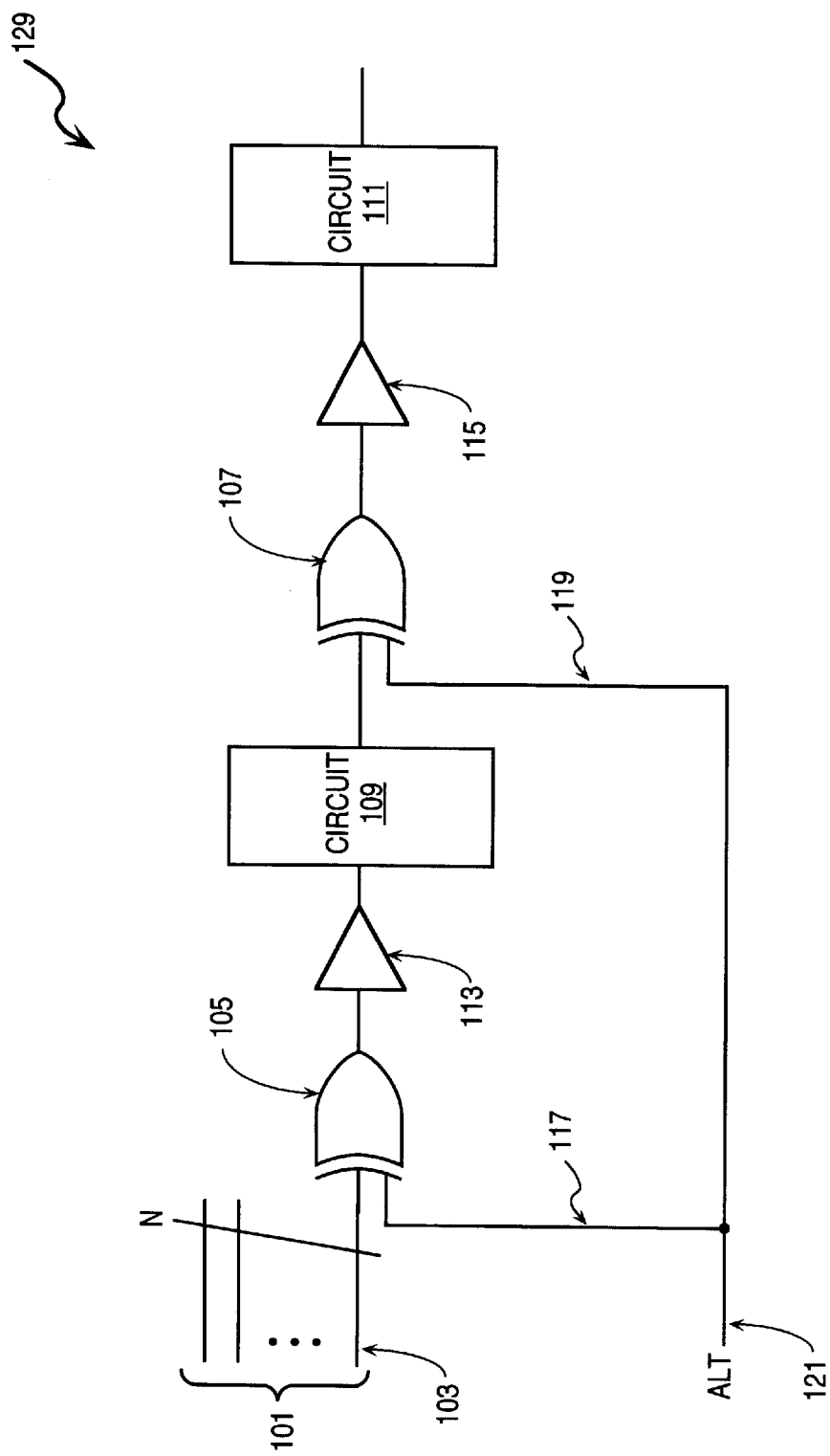
FIG. 7 is an embodiment of the invention using an XOR gate to separate multiple circuit blocks.

FIG. 7 shows an arrangement for reducing peak power of an electronic system by inserting XOR gates. For circuit 129 shown in FIG. 7, XOR gate 107 is inserted between circuits 109 and 111. The XOR gate 105 is inserted before circuit 109.

Circuits 109 and 111 are multiple circuit blocks that operate on the data in a buffered fashion. Buffer 115 resides between circuits 109 and 111. Buffer 113 resides in front of circuit 109. Alternatively, circuits 109 and 111 could operate on the data in a pipelined fashion.

Signal 103 is one of N signal lines that comprise data bus 101. Data is sent along signal line 103 and is supplied as an input to XOR gate 105. XOR gate 105 also receives the ALT signal as an input via lines 121 and 117. The output of XOR gate 105 passes through buffer 113 and is supplied as an input to circuit 109.

The output from circuit 109 is supplied as an input to XOR gate 107. The ALT signal is also supplied as an input XOR gate 107 via lines 121 and 119. The output of XOR gate 107 passes through buffer 115 to circuit 111. The output from circuit 111 then is sent to the rest of the electronic system (not shown).

If circuit 109 has been configured to handle input data that has been altered by an XOR operation with the ALT signal, then the circuitry 129 can reduce peak power in comparison to an electronic system that does not include the ALT signal and XOR gates 105 and 107. That is because circuitry 129 reduces the sum of signal transitions.

Figure 8:
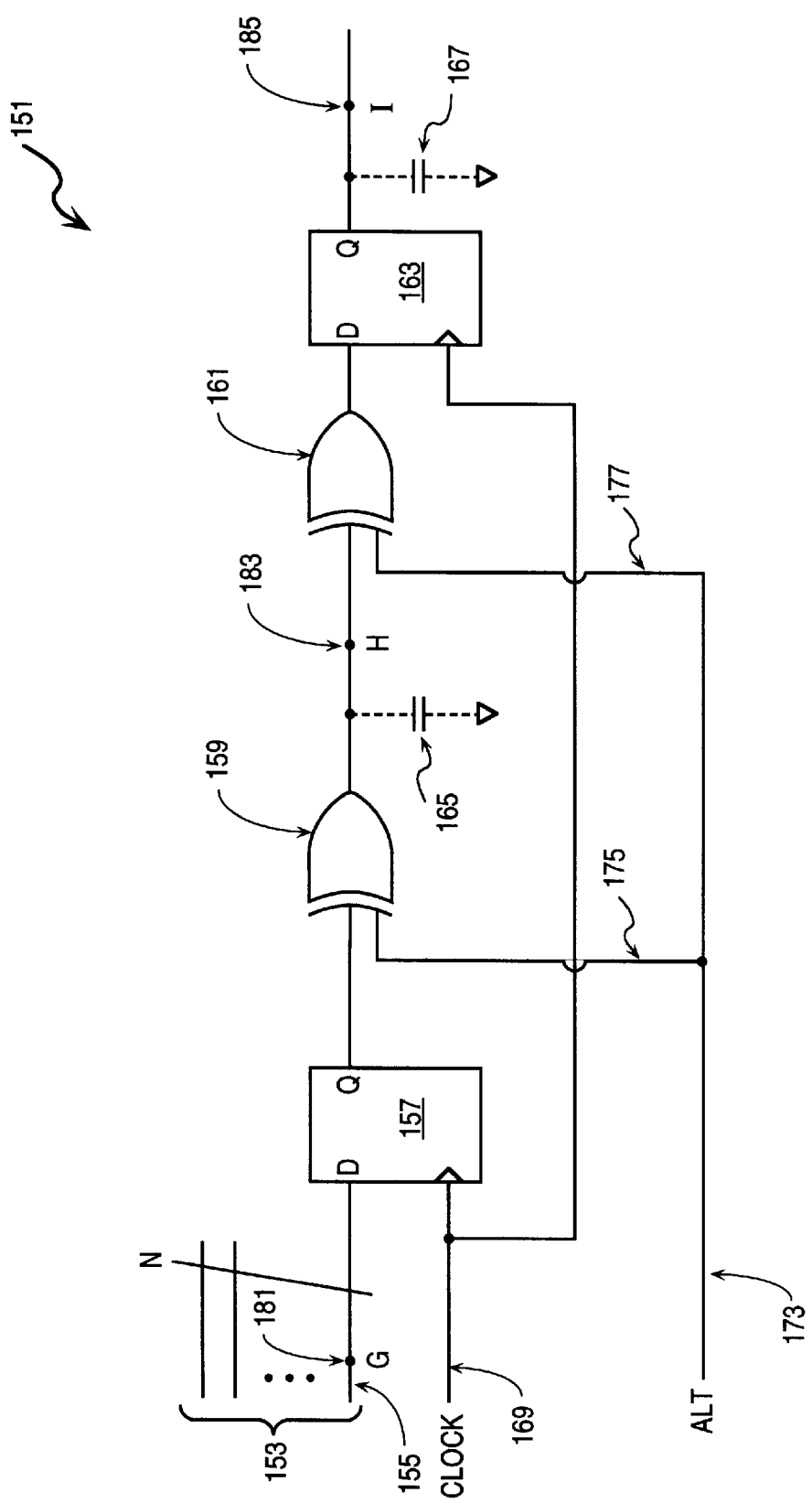
FIG. 8 is an embodiment having registers, XOR gates, and an ALT signal.

FIG. 8 shows an embodiment of the invention that has registers rather than buffers. For circuitry 151 of FIG. 8, registers 157 and 163 replace the buffers 62 and 64 of circuitry 55 of FIG. 3. Registers 157 and 163 isolate or buffer portions of signal line 155.

In FIG. 8, data signal line 155 is one of N signal lines of data bus 153. The output of register 157 goes to XOR gate 159. The ALT signal is supplied as an input to XOR gate 159 via lines 173 and 175. The output of XOR gate 159 is supplied as an input to XOR gate 161. The ALT signal is supplied as a second input to XOR gate 161 via lines 173 and 177. The output of XOR gate 161 is supplied as an input to register 163. Registers 157 and 159 are clocked via line 169.

The line at point H (also referred to as point 183) is of relatively high capacitance, as indicated by capacitor 165. The line at point I (also referred to as point 185) is also of relatively high capacitance, as indicated by capacitor 167.

Circuitry 151 of FIG. 8 operates in a manner similar to that of circuitry 55 of FIG. 3. For one embodiment, the ALT signal is a periodic signal having a square wave pattern. The data waveform at point G has a certain format or pattern. The output of XOR gate 161 is a data waveform that has the same format as the waveform at point G. Thus, the data waveform at point H has an altered pattern, but the data waveform at point I has the same format as the data waveform at point G.

For an ALT signal that toggles, the sum of the signal transitions at points H and I is "one." There are no double toggles at points H and I for a toggling ALT signal. Thus, circuitry 151 reduces the worst-case power dissipation.

Figure 9:
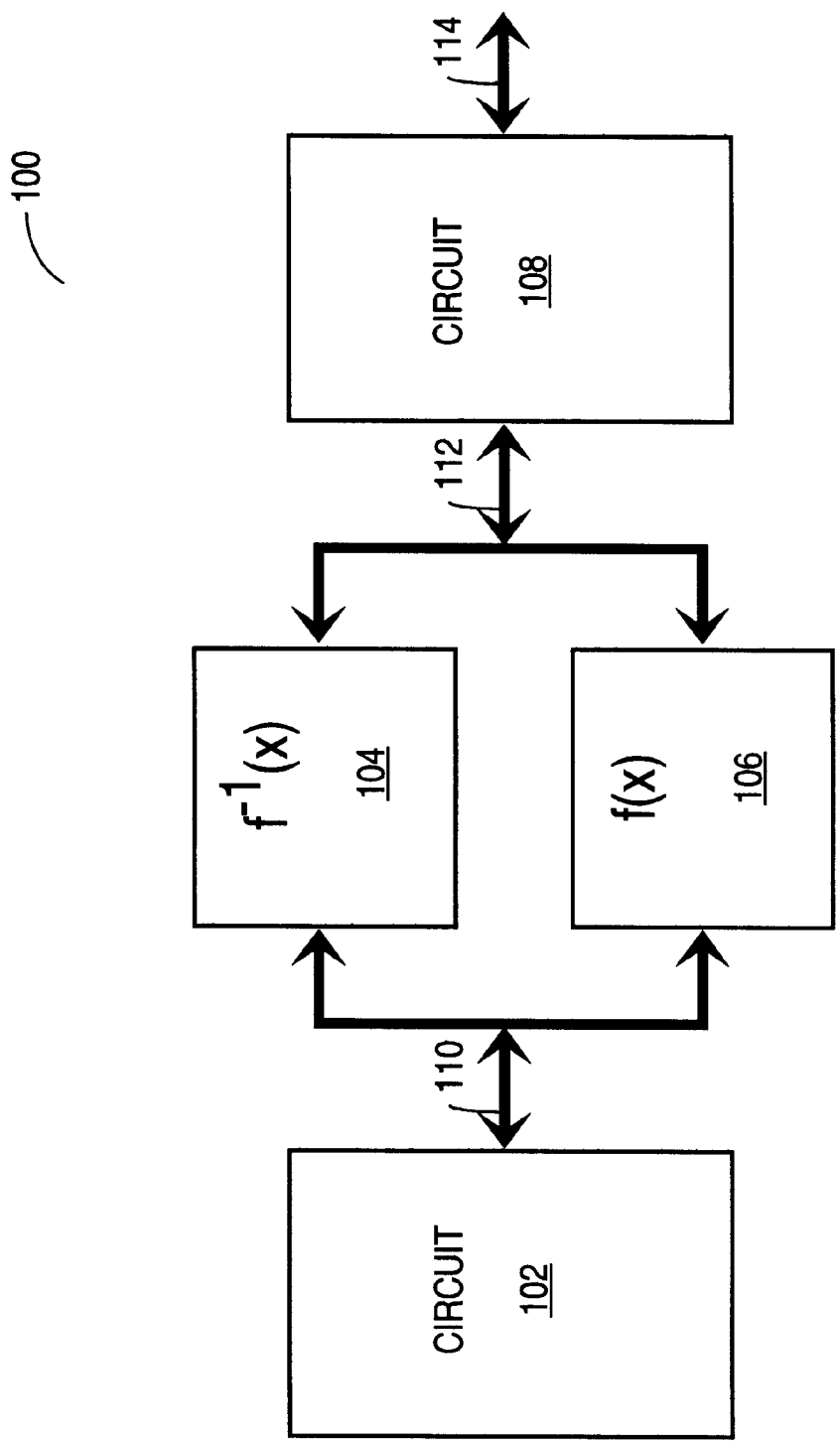
FIG. 9 is a block diagram of a system with bidirectional reformatting circuitry.

FIG. 9 illustrates a bidirectional circuit 100 for reducing worst-case power. System 100 includes circuit 102, circuit 108, and reformatting circuitry 104 and 106. System 100 may be included in any integrated circuit, in any plurality of integrated circuits, or as discrete components. Circuits 102 and 108 may be any circuits that can store or buffer data, including a register, flip-flop, memory cell, buffer, transceiver, or the like. Circuit 108 can communicate with other circuits (not shown) over bus 114.

For one embodiment, reformatting circuitry 106 is configured like circuitry 55 from FIG. 3 and supplies data from circuit 102 to circuit 108. Reformatting circuitry 104 is configured in the opposite away, and supplies data from circuit 108 to circuit 102. Thus, reformatting circuitry 104 is similar to circuitry 55, but supplies data in the opposite direction.

Figure 10:
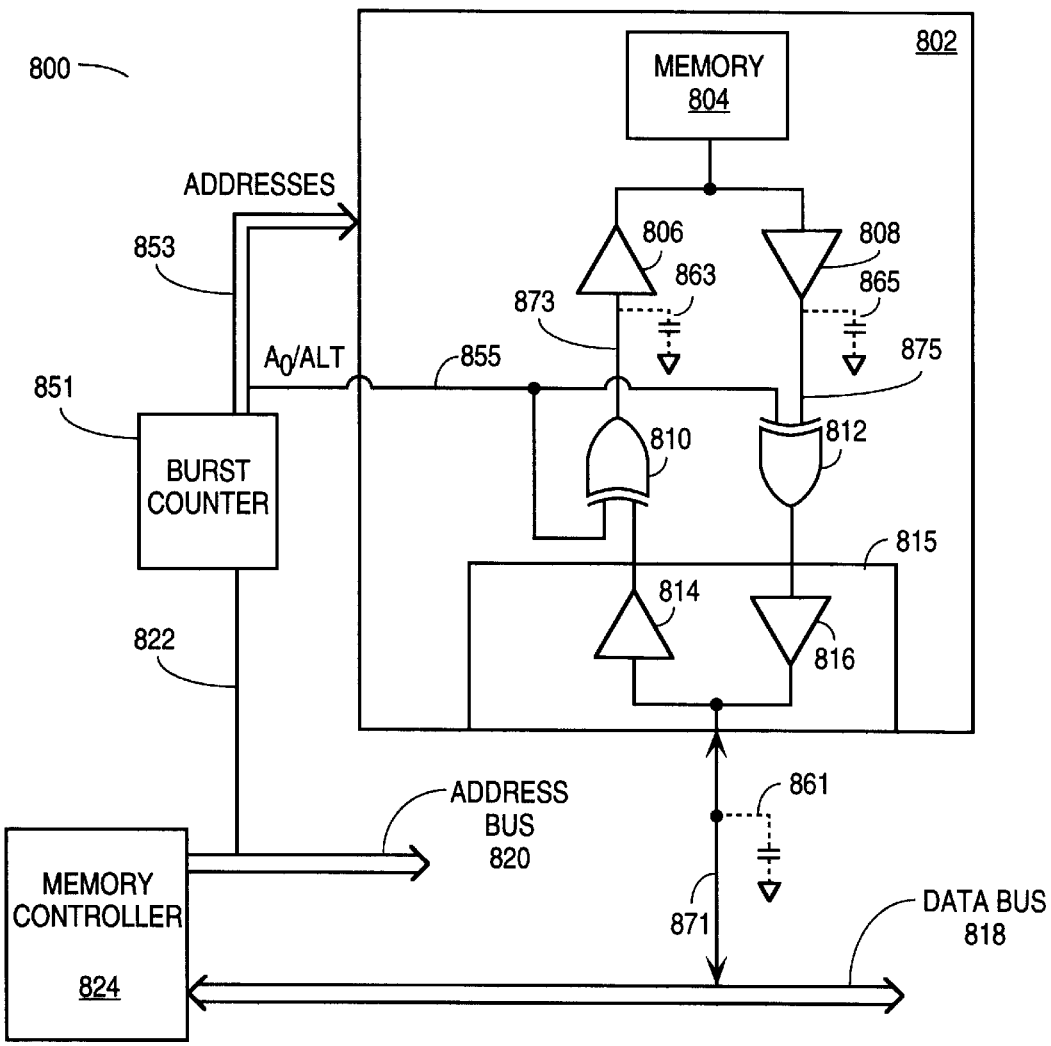
FIG. 10 shows reformatting circuitry incorporated into a memory system with a burst counter.

FIG. 10 shows a memory system 800 that employs reformatting circuitry. Memory system 800 includes a memory controller 824 that provides address information over address bus 820. Memory controller 824 also sends and receives data over data bus 818. Memory device 802 may be any type of volatile or non-volatile memory device that includes memory 804, data bus interface 815, read and write drivers (buffers) 806 and 808, and reformatting circuitry comprising XOR gates 810 and 812. In the interest of clarity, a data path for communicating one bit of data between data bus 818 and memory 804 is illustrated. Elements 806, 808, 810, 812, 814, and 816 may be duplicated for additional parallel communicated bits, however.

Burst counter 851 generates certain burst addresses for memory 804. Memory controller 824 preloads burst counter 851 with an address via lines 822. Burst counter 851 then generates a sequence of burst addresses on address lines 853 for memory 804. All the address bits appear on address lines 853, including address $A_0$, which is the least significant address bit.

Data is written from memory controller 824 to an address of memory array 804 via data bus 818, lines 871, driver 814, XOR gate 810, and driver 806. The write data is provided in a first format over data bus 818 and sent to XOR gate 810 via lines 871 and driver 814.

For one embodiment, address bit $A_0$—namely, the least significant address bit—is also used to generate the ALT signal on line 855 that is applied as an input to XOR gates 810 and 812. For one embodiment, the address rate on lines 853 is the same rate as the data rate on line 818. When there is a linear burst of addresses, there is a linear stepping through of addresses. It follows that the address bit $A_0$ toggles at the maximum rate of the addresses and thus is well-suited to function also as an ALT signal for the reformatting circuitry.

For alternative embodiments, other address bits or other signals could be used as the ALT signal for XOR gates 810 and 812, and the frequencies of the other ALT signals could be the same or less than that of the data.

For another alternative embodiment, a Grey code burst, rather than a linear burst, is employed. For that alternative embodiment, a decoder could be used to produce an ALT signal having a regular square wave pattern of ones and zeros.

The XOR gate 810 of FIG. 10 functions as a reformatter when provided with a toggling input. Assuming address bit $A_0$ is the ALT signal, XOR gate 810 will provide logically complemented data to memory 804 on odd addresses (i.e., $A_0$ equal to one), and will provide logically uncomplemented data to memory 804 on even addresses (i.e., $A_0$ equal to zero). The XOR gate 810 in effect functions as a selective inverter. Thus, memory 804 will not necessarily store the exact bit pattern as provided on data bus 818. Data integrity will nevertheless be maintained because the read path includes XOR gate 812 that, together with the same signal $A_0$/ALT signal on line 855, will reformat the read data to the correct states before passing the data to driver 816 and data bus 818.

The advantage of placing reformatting XOR circuits 810 and 812 in the write and read paths is that the summation of the number of signal toggles is reduced as the data passes between data bus 818 and memory 804. This reduces the worst-case power consumed. For one embodiment, lines 871, 873, and 875 are high capacitance lines, as indicated by respective parasitic capacitors 861, 863, and 865.

Figure 11:
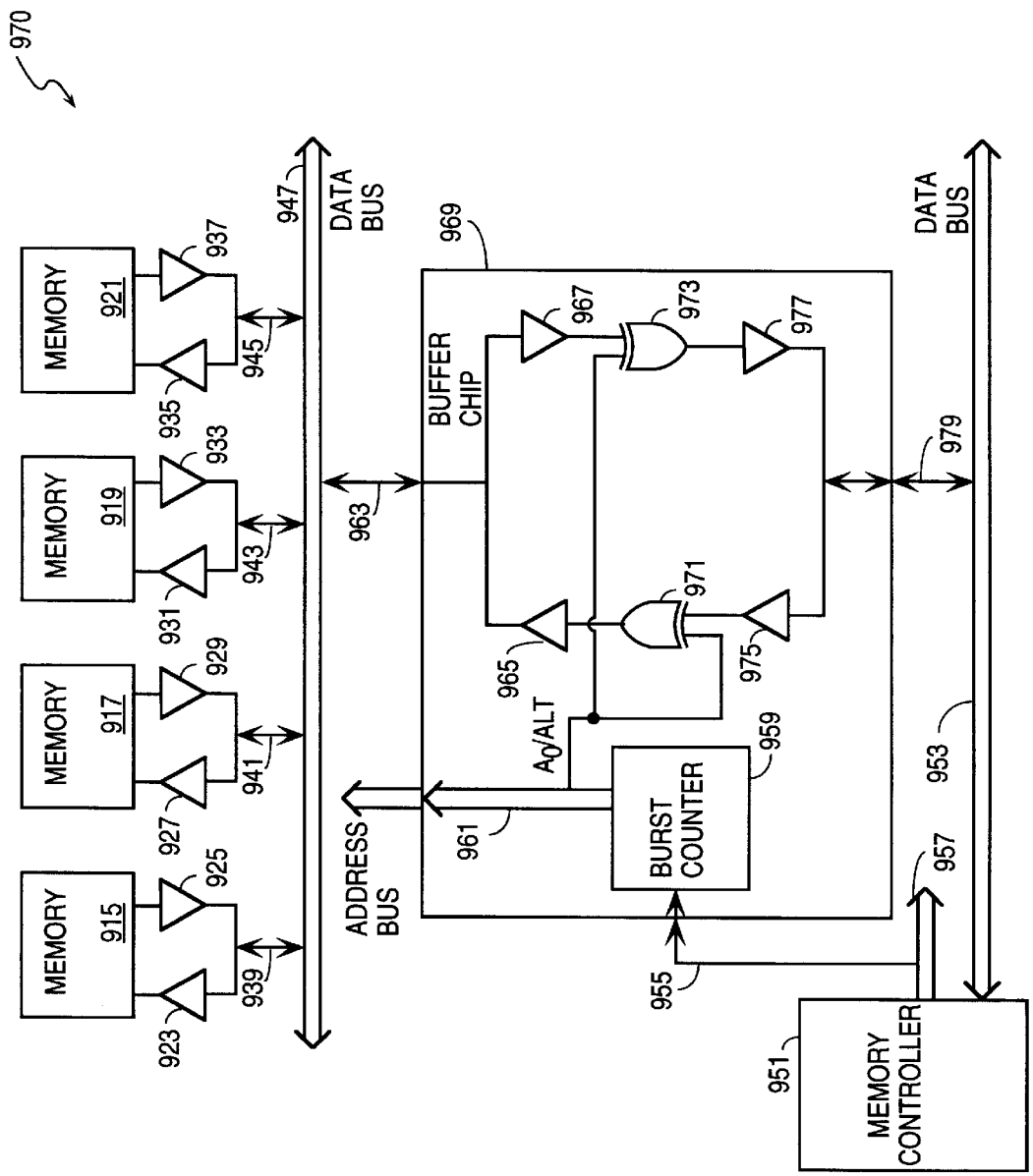
FIG. 11 shows reformatting circuitry in a buffer chip with a burst counter for multiple memories.

FIG. 11 shows memory system 970, that has multiple memories 915, 917, 919, and 921 and a separate buffer chip 969 containing reformatting XOR gates 971 and 973.

Memory controller 951 provides addresses over address bus 957. Memory controller 951 also sends and receives data over data bus 953. Certain addresses are preloaded by memory controller 951 into burst counter 959 via lines 955. Burst counter 959 is part of the separate buffer chip 969. Burst counter 959 then generates a linear burst of addresses over address lines 961, which are used to address memory locations in memories 915, 917, 919, and 921.

For one embodiment, the least significant address bit $A_0$ from the addresses on address bus 961 is used to also generate an ALT signal that is applied as an input to XOR gates 971 and 973. The XOR gates 971 and 973 act as data reformatters. Data from data bus 953 is sent via lines 979 and buffer 975 to be applied as an input to XOR gate 971. The reformatted data output from XOR gate 971 passes through buffer 965 and lines 963 to data bus 947. The reformatted data is then stored in the appropriate memory of memories 915, 917, 919, and 921 via respective lines 939, 941, 943, and 945 and respective buffers 923, 927, 931, and 935. The address associated with the reformatted data determines the memory storage location. The reformatted data is retrieved from one of the memories 915, 917, 919, and 921 via respective buffers 925, 929, 933, and 937 and respective lines 939, 941, 943, and 945 depending upon the address. The reformatted data passes over data bus 947 and through lines 963 and buffer 967 to be applied as an input to XOR gate 973. The output of XOR gate 973 is data in its original format. That original data then passes through buffer 977 and lines 979 onto data bus 953.

FIG. 11 shows one XOR gate 971 and one XOR gate 973. The depiction in FIG. 11 is for one data bit, so there would be multiple XOR gates in buffer chip 969, two for each of the N data lines of data bus 953.

The reformatting XOR gates 971 and 973 of buffer chip 969 help to reduce the peak power of memory system 970 because the number of multiple signal toggles is reduced as data is stored or retrieved from one of the memories 915, 917, 919, and 921.

Figure 12:
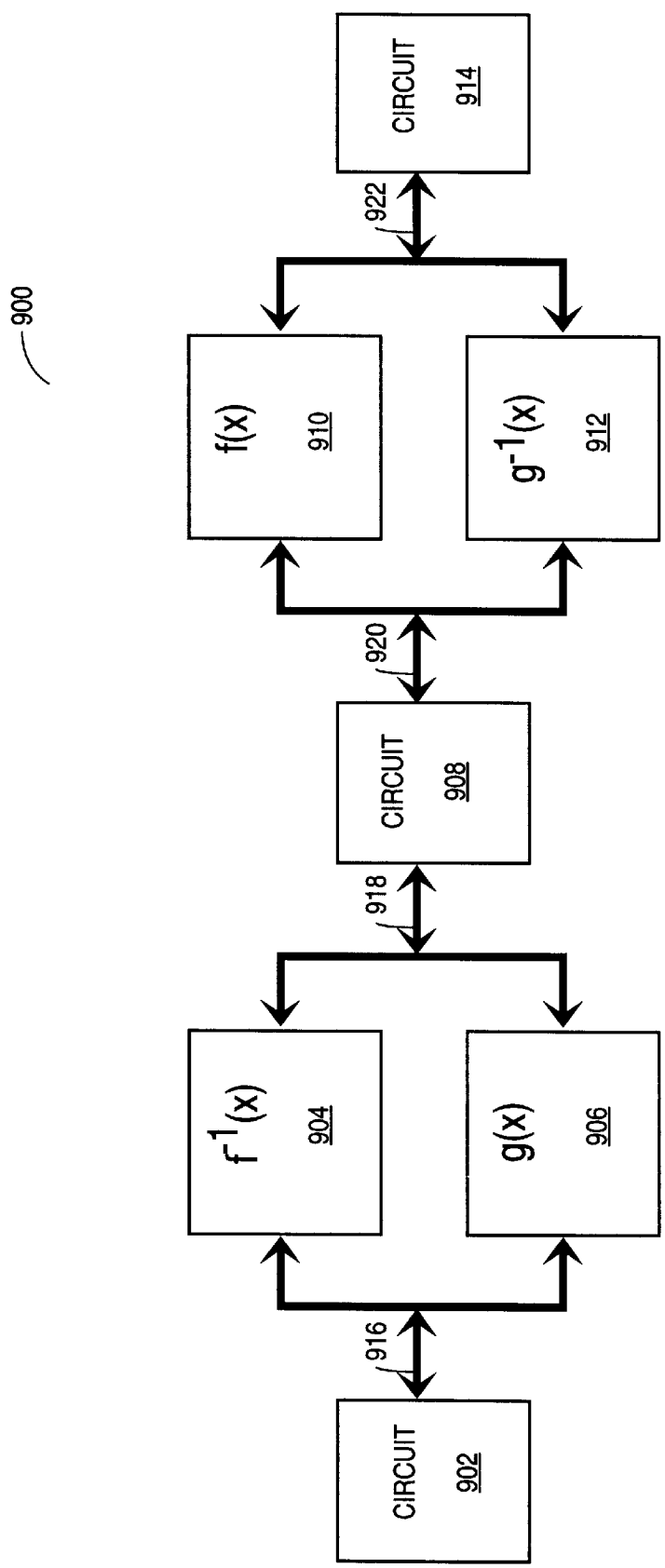
FIG. 12 is a block diagram of a pipelined system with bidirectional reformatting circuits.

FIG. 12 is a block diagram of a pipelined system 900 that employs bidirectional reformatting circuitry. System 900 includes pipelined circuits 902, 908, and 914, and reformatting circuitry 904, 906, 910, and 912. System 900 may be included in any integrated circuit, in any plurality of integrated circuits, or as discrete components. Circuits 902, 908, and 914 may be any circuits that can store or buffer data, including a register, flip-flop, memory cell, buffer, transceiver or the like.

Circuit 902 provides data to circuit 908 via bus 916, reformatting circuit 906, and bus 918. Circuit 908 provides data to circuit 902 via bus 918, reformatting circuit 904, and bus 916. Circuit 908 provides data to circuit 914 via bus 920, reformatting circuit 912, and bus 922. Circuit 914 provides data to circuit 908 via bus 922, reformatting circuit 910, and bus 920. Reformatting circuits 904, 906, 910, and 912 are similar to circuit 55 of FIG. 3. Reformatting circuits 904, 906, 910, and 912 reduce the summation of signal toggles, thus reducing peak power.

Figure 13:
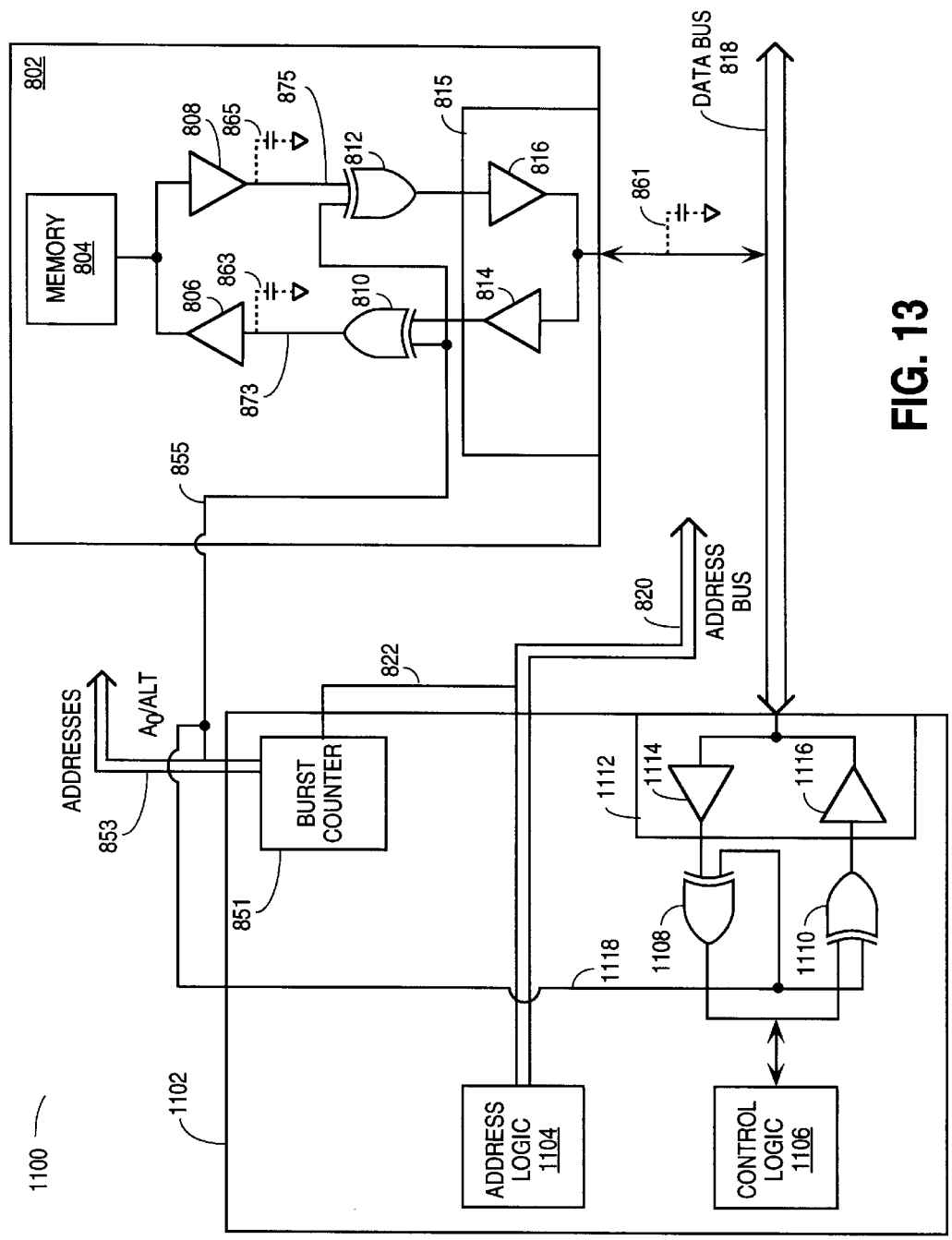
FIG. 13 is a diagram of a system that includes reformatting circuitry coupled to a memory and reformatting circuitry coupled to memory control logic.

FIG. 13 shows a memory system 1100 that includes memory controller 1102 that provides address information over address bus 820. Memory controller 1102 also sends and receives data over data bus 818. Memory controller 1102 includes address logic 1104, burst counter 851, control logic 1106, reformatting circuitry comprising XOR gates 1108 and 1110, and bus interface 1112. Address logic 1104 provides address signals to address bus 820. Address bit $A_0$—the least significant address bit—from address bus 853 is used as the ALT signal applied as an input to XOR gates 1108 and 1110 via line 1118. Control logic 1106 communicates data with data bus 818 through XOR gates 1108 and 1110, and through bus interface 1112.

Burst counter 851 is used to generate certain burst addresses for memory 804. Memory controller 1102 provides burst counter 851 with an address via lines 822. Burst counter 851 then generates a sequence of burst addresses on address lines 853 for memory 804. All the address bits appear on address lines 853, including address $A_0$, which is the least significant address bit.

Data is written from memory controller 1102 to an address of memory device 802 via XOR gate 1110 and driver 1116. The write data is provided in a first format from control logic 1106 to one input of XOR gate 1110. Together with the address $A_0$ signal on line 1118, XOR gate 1110 reformats the data into a second format that is driven onto data bus 818 by driver 1116.

For one embodiment, address bit $A_0$ is also used to generate the ALT signal on line 855 and 1118 that is applied as an input to XOR gates 810, 812, 1108, and 1110. For one embodiment, the address rate on lines 853 and 1118 is the same rate as the date rate on lines 818. The address bit $A_0$ toggles at the maximum rate of the addresses and thus functions also as the ALT signal for the reformatting circuitry.

For an alternative embodiment, a Grey code burst, rather than a linear burst, is employed. For that alternative embodiment, a decoder could be used to produce an ALT signal having a regular square wave pattern of ones and zeros.

The XOR gate 810 of FIG. 13 functions as a reformatter when provided with a toggling input. Memory device 802 will reformat the data through XOR gate 810 prior to storing the data in memory 804. Data can be read from memory 804 through XOR gate 812, data bus 818, driver/receiver 1114 and XOR gate 1108. For alternative embodiments, the reformatting circuitry may only be included in memory controller 1102, or only in memory device 802.

For alternative embodiments, other periodic or alternating signals besides an address signal may also be used to clock XOR gates 1108, 1110, 810, and 812. These alternating signals can have a non-zero frequency that is the same or less than the frequency of the data transmission.

The reformatting logic shown in FIG. 13 thus reformats the data sent to and from control logic 1106 and to and from memory 804. Reformatting the data reduces the peak power requirements because multiple signal toggles are reduced.

Figure 14:
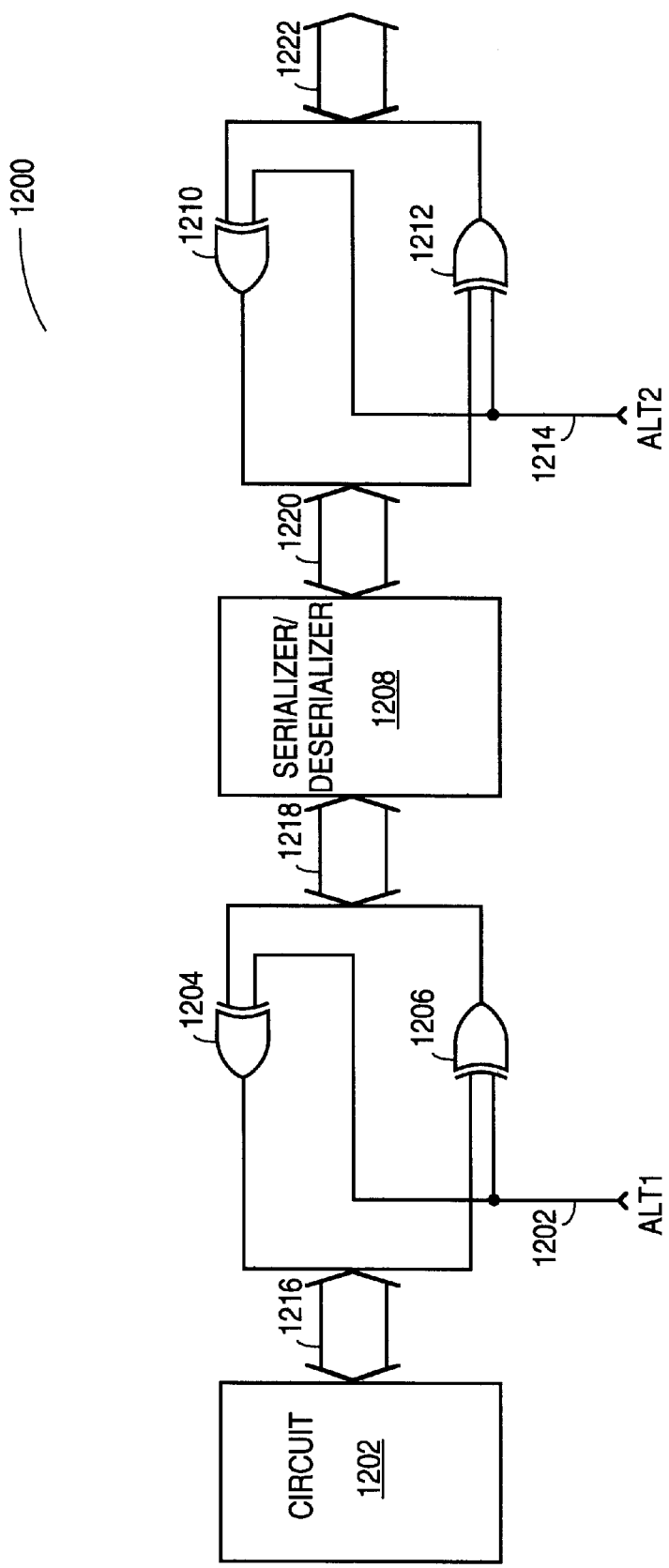
FIG. 14 shows reformatting circuitry used in a system having two buses of different widths.

FIG. 14 shows a system 1200 that includes circuit 1202, serializer/deserializer 1208, and reformatting circuits. The first reformatting circuit includes XOR gates 1204 and 1206, and the second reformatting circuit includes XOR gates 1210 and 1212. One pair of XOR gates is provided for each signal line on each of buses 1218 and 1220. The XOR gates 1204, 1206, 1210, and 1212 reformat the data patterns sent between circuits to reduce the power dissipated by the system. For this embodiment, serializer/deserializer 1208 also interfaces buses of different bus widths. Data bus 1218 is wider than data bus 1220. Thus, on a bit-by-bit basis, serializer/deserializer 1208 takes a number of bits from bus 1218 and serializes them for bus 1220. Similarly, on a bit-by-bit basis, serializer/deserializer 1208 deserializes a serial bit stream on one signal line of bus 1220 for bus 1218.

Given that data buses 1218 and 1220 have dissimilar widths, the maximum data rate on each bus may be different. Thus, a different alternating signal is provided to each reformatting XOR pair. XOR pairs 1204 and 1206 receive an ALT1 signal on signal line 1202, and XOR pair 1210 and 1212 receive an ALT2 signal on signal line 1214. ALT1 has a data rate that matches the highest data rate of bus 1218, and ALT2 has a data rate that matches the highest data rate of bus 1220. ALT1 and ALT2 can be generated from one or more counters, clock sources, or other circuitry. For alternative embodiments, the frequency of the ALT1 signal can be the same as or less than the frequency of the data on bus 1218, and the frequency of the ALT2 signal can be the same as or less than the frequency of the data on bus 1220.

For one embodiment, system 1200 is included in a memory device in which circuit 1202 is a memory array, ALT1 is a higher-order address signal, XOR pair 1210 and 1212 directly or indirectly provide data to a data bus 1222, and ALT2 is another address signal such as the least significant address bit (i.e., $A_0$).

Figure 15:
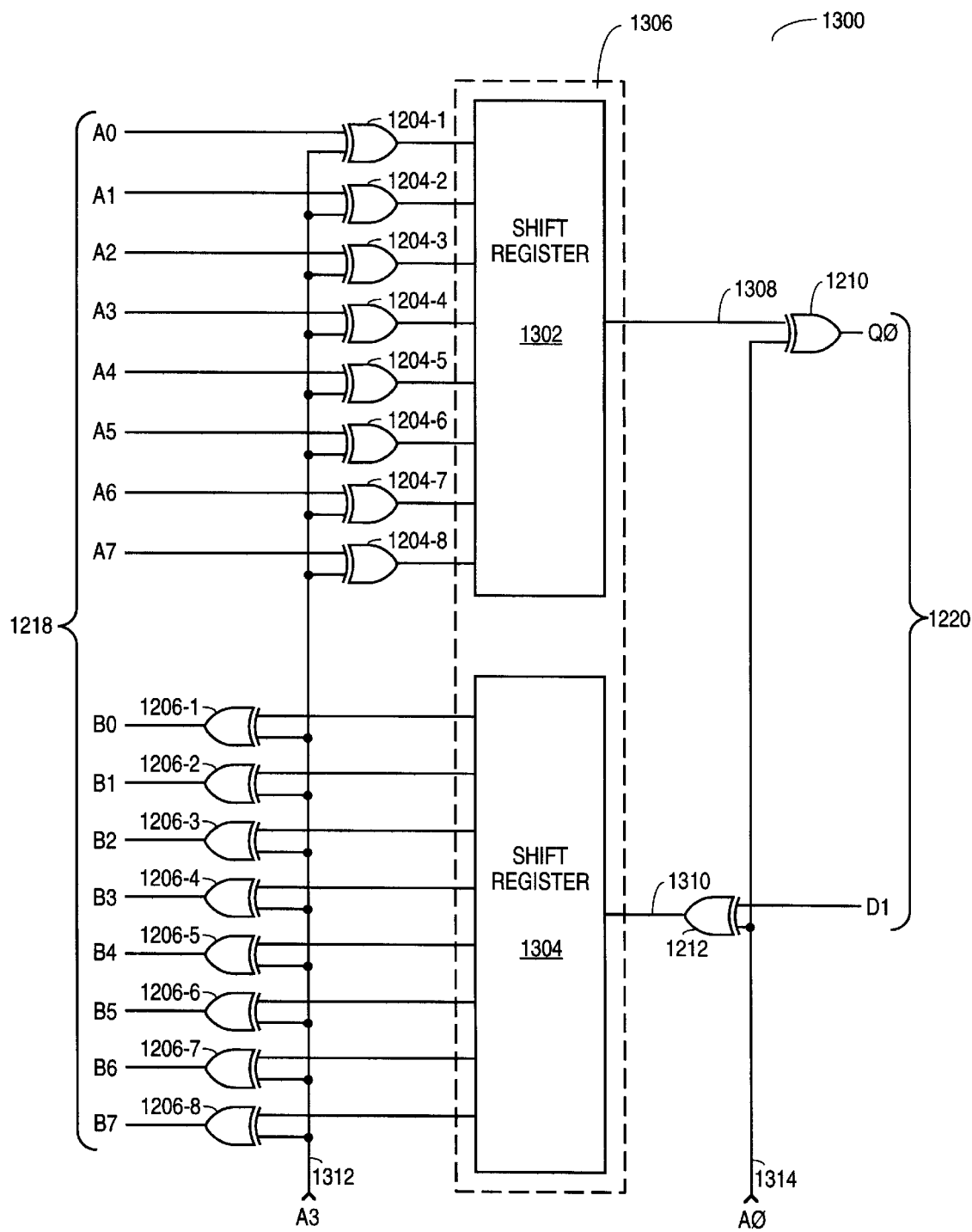
FIG. 15 is a diagram of a serializer/deserializer.

FIG. 15 shows a system 1300 in which a serializer/deserializer 1306 is an 8:1 serializer and a 1:8 deserializer for a particular word of data. Many words may be included in bus 1218, and many corresponding single bit lines may be included in bus 1220.

Serializer/deserializer 1306 includes shift register 1302 that takes eight bits from lines $A_0$–$A_7$ of bus 1218 and serializes the bits into a stream of data onto signal line 1308. Serializer/deserializer 1306 also includes shift register 1304 that takes a bit stream from signal line 1310 and deserializes the bit stream into a plurality of parallel driven bits B0–B7 on bus 1218. In this example, the maximum data rate of bus 1218 is ⅛ that of bus 1220. Thus, the least significant address bit A0 can be used in a linear burst read or write mode to clock XOR gates 1210 and 1212 on line 1314, and a signal having ⅛ the data rate of A0 can be used to clock XOR gates 1204-1 through 1204-8 and XOR gates 1206-1 through 1206-8. For a linear burst read or written operation, address signal A3 may be used as the signal on line 1312. This implementation may be further extended to use other address signals when the data bus widths are of different sizes (e.g., A4 when each bit on data bus 1220 corresponds to 16 bits on data bus 1218, etc.). For other embodiments, other alternating signals having the appropriate data rates may be used provided the appropriate clock signals to the XOR gates.

Figure 16:
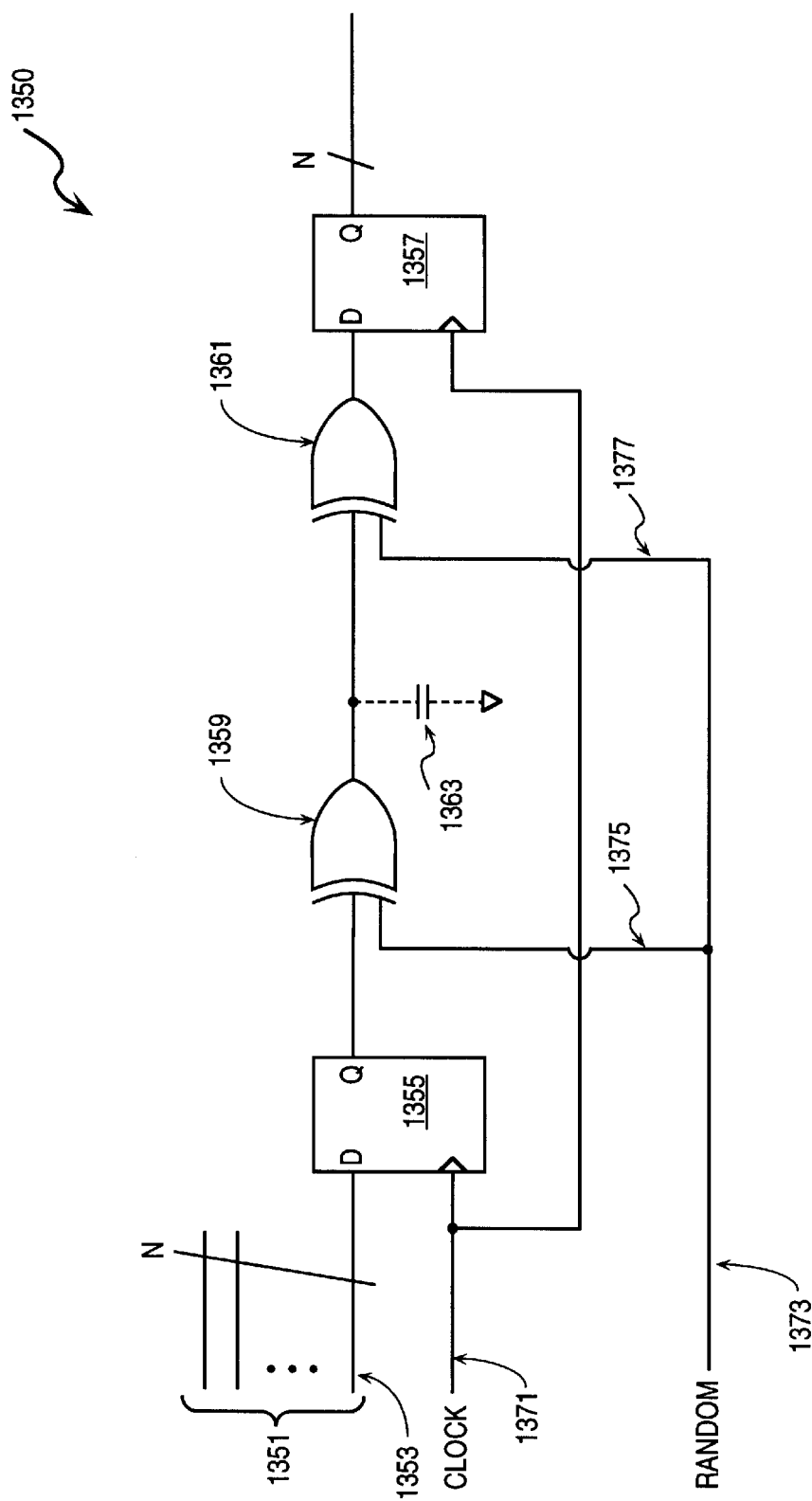
FIG. 16 is a diagram of reformatting circuitry using a random bit stream approach.
Figure 17:
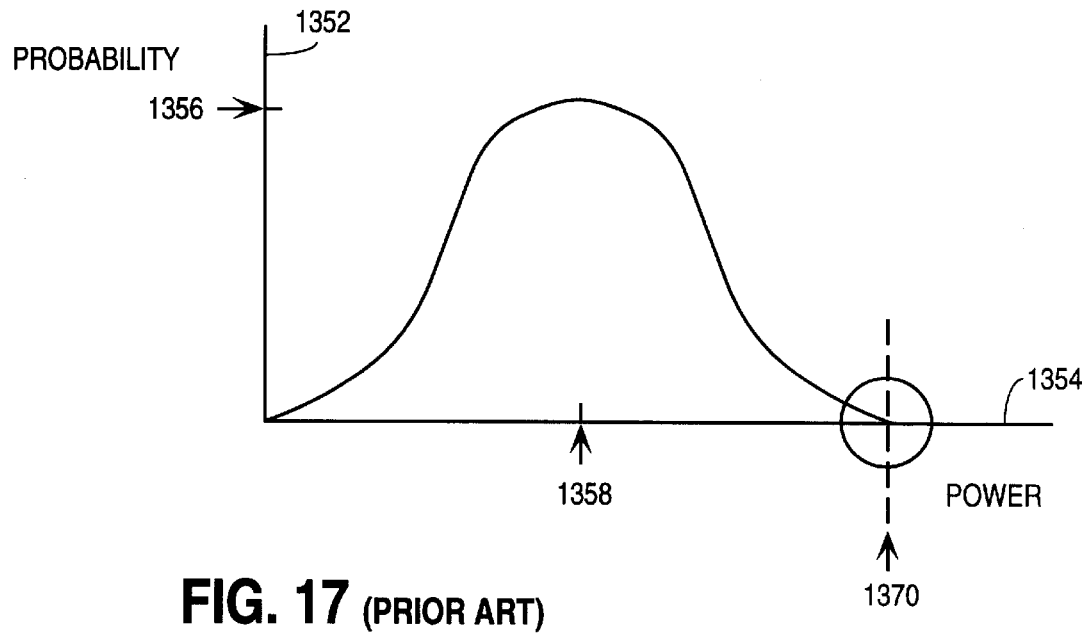
FIG. 17 is a graph of power versus probability for prior art circuitry without reformatting circuitry.
Figure 18:
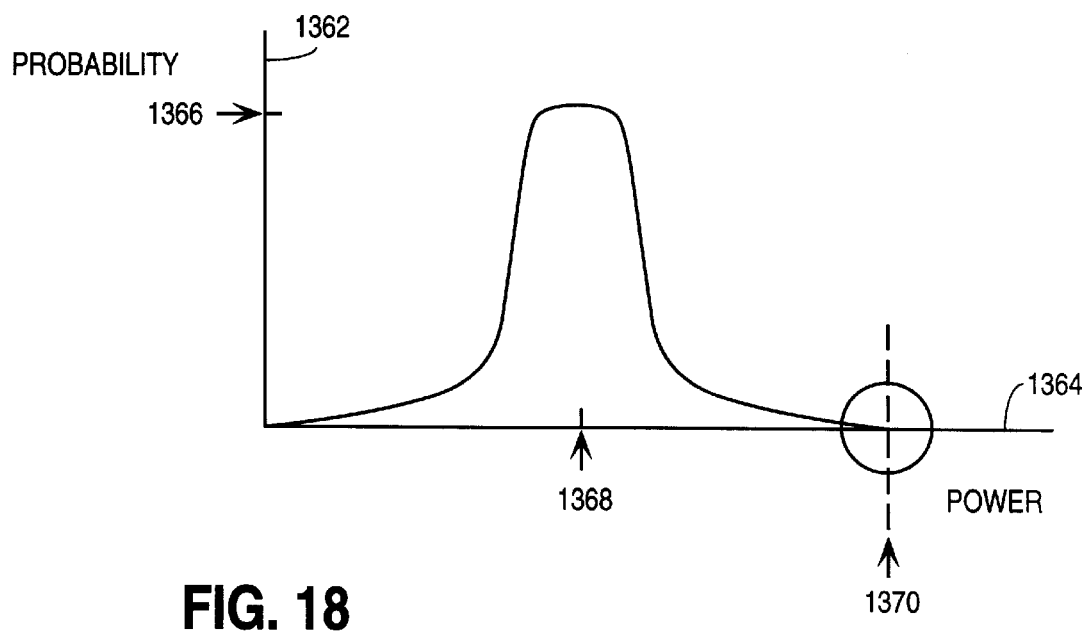
FIG. 18 is a graph of power versus probability for a circuit with reformatting circuitry using a random bit stream approach.

FIG. 16 shows reformatting circuitry 1350 that uses a random bit stream signal rather than an ALT signal as an input to XOR gates 1359 and 1361. As shown in FIGS. 17 and 18, reformatting circuitry 1350 changes the power probability distribution.

Reformatting circuitry 1350 of FIG. 16 includes a data signal line 1353 that is one of N data signal lines of data bus 1351. Registers 1355 and 1357 are clocked via line 1371. Data register 1355 receives data at input D and outputs data at output Q to XOR gate 1359.

The XOR gate 1359 also receives as an input a random bit stream of ones and zeros via lines 1373 and 1375. For one embodiment, the random bit stream is generated by a pseudo-random number generator (not shown).

The output of XOR gate passes over a high capacitance line or net to an input of XOR gate 1361. The high-capacitance of the line between XOR gates 1359 and 1361 is indicated by parasitic capacitor 1363.

The XOR gate 1361 receives as an input the random bit stream via lines 1373 and 1377. The output of XOR gate 1361 is sent to the D input for register 1357. The Q output of register 1357 in turn provides an output.

The reformatting circuitry shown in FIG. 16 is repeated for each of the N lines of data bus 1351.

The data pattern output from register 1357 is the same as the data pattern input to register 1355. The data pattern that is output from XOR gate 1359 is reformatted, however, based on the XOR operation performed by XOR gate 1359. The XOR gate 1361, however, puts the data back into the same pattern that was applied as an input to register 1355.

When both the data stream on line 1353 and the random bit stream on line 1373 are toggling, the number of multiple data bit stream toggles are reduced, thereby reducing peak power. Because the random bit stream is not always toggling, the power requirements associated with the random bit stream itself are somewhat reduced over a scheme such as shown in FIG. 3 that uses a square-wave ALT signal.

The advantage of reformatting circuitry 1350 of FIG. 16 are further explained by referring to FIGS. 17 and 18.

FIG. 17 is a plot of probability (axis 1352) versus power (axis 1354) for a prior art data signal line without XOR reformatting circuitry. The power distribution depends on the probability of data signal toggles on the data signal line. Peak power (also called worst-case power) occurs at point 1370, which occurs when the data on the data signal line toggles at the maximum rate. Steady operation at the theoretical worst-case power at point 1370 is unlikely, but should be considered in designing the circuitry.

Point 1358 represents the average power and point 1356 represents the highest probability.

FIG. 18 is a plot of probability (axis 1362) versus power (axis 1664) for reformatting circuitry 1350 of FIG. 16 that includes a random bit stream. The power distribution of FIG. 18 depends not only on the probability of data signal toggles on the data signal line 1353, but also on the probability of toggles of the random bit stream on line 1373. The power distribution in FIG. 18 is accordingly more narrow than the power distribution in FIG. 17.

For FIG. 18, the peak power (or worst-case power) occurs at point 1370, which occurs when data on the data signal line toggles at the maximum rate and there is no toggling of the random bit stream. For FIG. 18, steady state operation of circuitry 1350 at the worst-case power point 1370 is highly unlikely and in most cases can be ignored.

Point 1368 represents the average power and point 1366 represents the highest probability.

Figure 19:
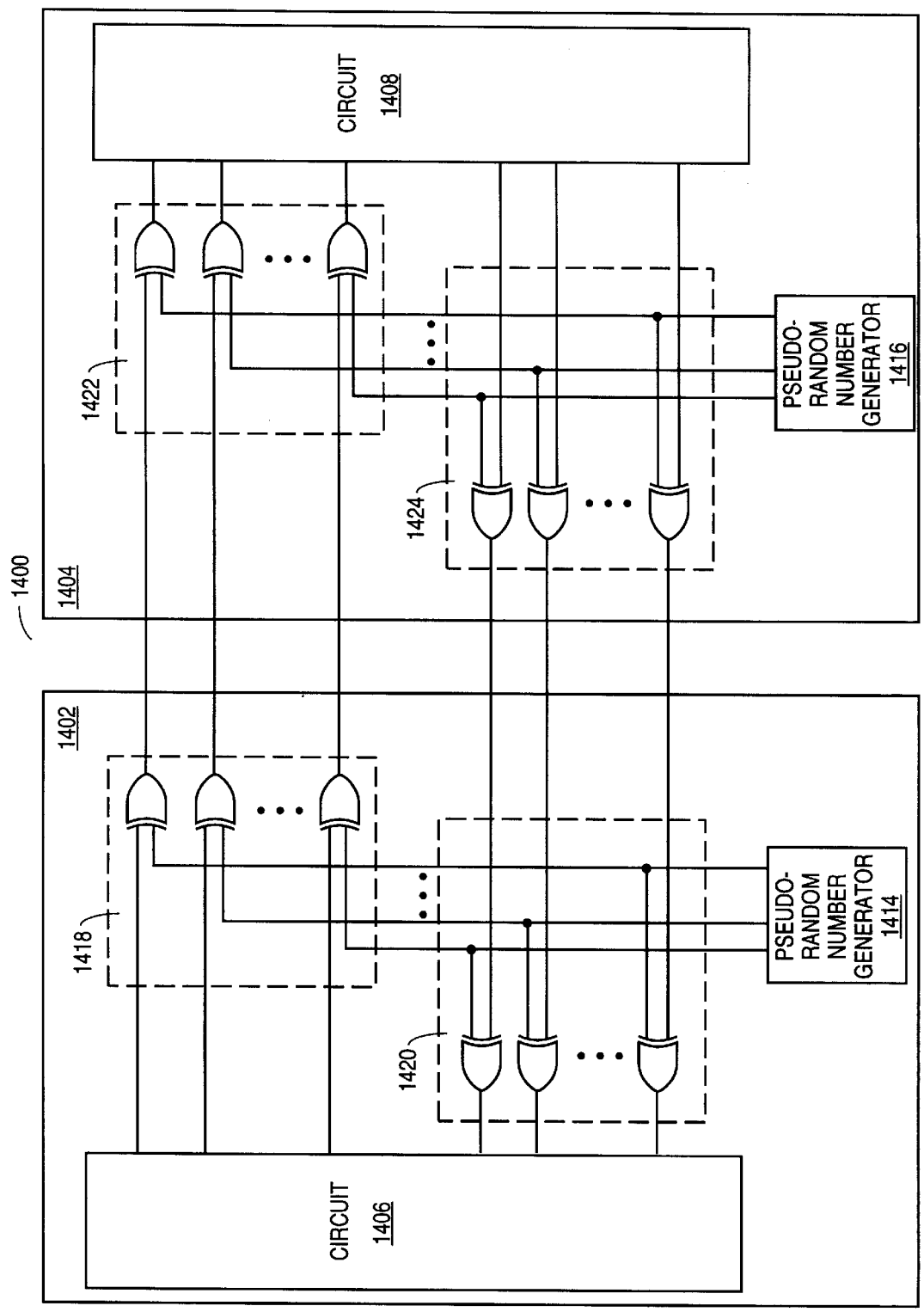
FIG. 19 shows a system having reformatting circuits and pseudo-random number generators.

FIG. 19 shows a system 1400 that, on average, will reduce the worstcase power dissipated by devices 1402 and 1404. Device 1402 includes circuit 1406, reformatting XOR circuitry 1418 and 1420, and a pseudo-random number generator 1414. Device 1404 includes circuit 1408, reformatting XOR circuitry 1422 and 1424, and a pseudo-random number generator 1416. Circuits 1406 and 1408 may be any circuitry, including memory arrays, control logic, or other circuitry. Data communicated between circuits 1406 and 1408 is reformatted or encoded and decoded by XOR circuits 1418, 1420, 1422, and 1424 in order to reduce the average worst-case power dissipated by devices 1402 and 1404. The average worst-case power is reduced when pseudo-random number generators 1414 and 1416 provide random numbers to the inputs of the XOR circuits 1418, 1420, 1422, and 1424. This has the affect of randomizing the data communicating between devices 1402 and 1404. Each pseudo-random number generator can be designed to generate the same sequence of random numbers such that coherency and data integrity can be maintained between devices 1402 and 1404. Each pseudo-random number generator can generate a new pseudo-random number at power up, or at any other time such that both pseudo-random number generators can coherently update the pseudo-random numbers. Additionally, the same pseudo-random number should be used for both outgoing data and incoming data to a device. For one embodiment, the pseudo-random numbers can be prestored in memory circuits in each device.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for reducing worst-case power consumption, comprising:

a first signal having signal transitions;

a circuit path for transmitting a second signal through buffered circuit sections;

logic circuitry coupled to the circuit path and to the first signal, wherein the logic circuitry uses the first signal to reduce a sum of signal transitions of the second signal as the second signal propagates from one buffered section of the circuit path to another buffered section of the circuit path in order to reduce worse-case power consumption.

2. The apparatus of claim 1, wherein the logic circuitry comprises exclusive-OR (XOR) circuitry.

3. The apparatus of claim 1, wherein the first signal comprises a signal with regular periodic transitions.

4. The apparatus of claim 1, wherein the logic circuitry comprises at least two exclusive-OR (XOR) gates located in the circuit path.

5. The apparatus of claim 1, wherein the buffered circuit sections include a first buffered circuit section, a second buffered circuit section, and a third buffered circuit section; and wherein the logic circuitry causes the second signal to have altered signal transitions in the second buffered circuit section in order to reduce worst-case power consumption.

6. The apparatus of claim 5, wherein the second signal has the same signal transitions in the firs and third buffered circuit sections.

7. The apparatus of claim 1, further comprising registers to buffer the buffered circuit sections.

8. The apparatus of claim 1, wherein the first and the second signals have the same frequency.

9. The apparatus of claim 1, wherein the second signal has a second frequency lower than a first frequency of the first signal.

10. The apparatus of claim 1, further comprising a clock to generate the first signal.

11. The apparatus of claim 1, further comprising a counter to generate the first signal.

12. The apparatus of claim 1, wherein the first signal is a toggling signal.

13. A method for reducing worst-case power consumption, comprising:

transmitting a signal having signal transitions through a plurality of buffered circuit sections;

propagating the signal from one buffered circuit section to another buffered circuit section of the plurality of buffered circuit sections; and reducing a sum of the signal transitions as the signal propagates.

14. The method of claim 13, where in reducing the sum of the signal transitions comprises altering the signal transitions of the signal in said another buffered circuit section.

15. The method of claim 13, further comprising:

receiving an input signal, and wherein the sum of the signal transitions is reduced using the input signal.

16. The method of claim 15, wherein the input signal has regular periodic transitions.

17. An apparatus, comprising:

means for transmitting a signal having signal transitions through a plurality of buffered circuit sections;

means for propagating the signal from one buffered circuit section to another buffered circuit section of the plurality of buffered circuit sections; and means for reducing a sum of the signal transitions as the signal propagates.

18. The apparatus of claim 17, wherein the means for reducing comprises means for altering the signal transitions of the signal in said another buffered circuit section.

19. The apparatus of claim 17, further comprising:

means for receiving an input signal, and wherein the sum of the signal transitions is reduced using the input signal.

20. A method of reducing peak-power, comprising:

transmitting a first signal having signal transitions through a plurality of buffered circuit sections, the first signal transmitted during a time period, the first signal having a constant high current level during a portion of the time period;

propagating the first signal from one buffered circuit section to another buffered circuit section of the plurality of buffered circuit sections; and applying a toggling signal to one of the plurality of buffered circuit sections to break up the constant high current level of the first signal.

21. The method of claim 20, wherein the plurality of buffered circuit sections includes a logic gate.

22. The method of claim 20, wherein the first signal has a first pattern before transmission through the plurality of buffered circuit sections similar to a second pattern after transmission through the plurality of buffered circuit sections.

* * * * *